(12) United States Patent
Roohparvar

(10) Patent No.: US 7,277,981 B2
(45) Date of Patent: *Oct. 2, 2007

(54) SCRATCH CONTROL MEMORY ARRAY IN A FLASH MEMORY DEVICE

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/651,777

(22) Filed: Jan. 10, 2007

(65) Prior Publication Data

US 2007/0113002 A1 May 17, 2007

Related U.S. Application Data

(63) Continuation of application No. 11/401,166, filed on Apr. 10, 2006, now Pat. No. 7,181,566, which is a continuation of application No. 10/431,766, filed on May 8, 2003, now Pat. No. 7,069,377.

(51) Int. Cl.
*G06F 12/14* (2006.01)
(52) U.S. Cl. .................................... 711/103
(58) Field of Classification Search .............. None
See application file for complete search history.

(56) References Cited

U.S. PATENT DOCUMENTS

| | | | |
|---|---|---|---|
| 4,930,129 A | 5/1990 | Takahira | |
| 5,539,699 A | 7/1996 | Sato et al. | |
| 5,742,616 A | 4/1998 | Torreiter et al. | |
| 5,867,430 A | 2/1999 | Chen et al. | |
| 5,890,192 A * | 3/1999 | Lee et al. | 711/103 |
| 6,041,001 A | 3/2000 | Estakhri | |
| 6,477,672 B1 | 11/2002 | Satoh | |
| 6,747,894 B2 | 6/2004 | Kawamura | |
| 6,901,498 B2 | 5/2005 | Conley | |
| 6,907,385 B2 | 6/2005 | Yasui | |
| 6,967,878 B2 | 11/2005 | Dono | |
| 7,069,377 B2 * | 6/2006 | Roohparvar | 711/103 |
| 2001/0052093 A1 | 12/2001 | Oshima et al. | |
| 2003/0204783 A1 | 10/2003 | Kuroda | |
| 2004/0049628 A1 | 3/2004 | Lin et al. | |
| 2004/0128594 A1 | 7/2004 | Elmhurst et al. | |

* cited by examiner

*Primary Examiner*—Hyung Sough
*Assistant Examiner*—Duc T. Doan
(74) *Attorney, Agent, or Firm*—Leffert, Jay & Polglaze P.A.

(57) ABSTRACT

A memory device has a scratch control array of non-volatile memory cells that is separate from the primary array of memory cells. The scratch control array stores an instruction sequence for execution by the memory device's controller circuit. The sequence can include instructions for testing of the memory device. The execution of the instruction sequence is initiated and the control circuit fetches each instruction from the scratch control array for execution. The results are then reported and/or stored in the scratch control array.

16 Claims, 6 Drawing Sheets

SCRATCH CONTROL MEMORY ARRAY IN A FLASH MEMORY DEVICE

RELATED APPLICATIONS

This application is a continuation of U.S. patent application Ser. No. 11/401,166 (allowed), filed Apr. 10, 2006 and titled, now U.S. Pat. No. 7,181,566 SCRATCH CONTROL MEMORY ARRAY IN A FLASH MEMORY DEVICE, which is a continuation of U.S. patent application Ser. No. 10/431,766, filed May 8, 2003, now U.S. Pat. No. 7,069,377, issued Jun. 27, 2006 and titled, SCRATCH CONTROL MEMORY ARRAY IN A FLASH MEMORY DEVICE, both of which are commonly assigned and incorporated by reference herein in their entirety.

TECHNICAL FIELD OF THE INVENTION

The present invention relates generally to memory devices and in particular the present invention relates to testing of memory devices.

BACKGROUND OF THE INVENTION

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices. Most electronic devices are designed with a single flash memory device.

Flash memory devices typically have controller circuits that are responsible for executing operations of the memory device. For example, the controller may execute instructions for erasing or programming the memory cells. An increase in the complexity of the flash memory devices has created a need for more complex controller circuits on the device.

Some flash memory devices use a microsequencer as the controller circuit. This is an internal state machine that steps through a sequence of operations to achieve a certain goal. The microsequencers rely on hard coded sequences for the different operations of the flash memory device.

Typical flash memory uses a single bit-per-cell. Each cell is characterized by a specific threshold voltage or $V_t$ level. Electrical charge is stored on the floating gate of each cell. Within each cell, two possible voltage levels exist. These two levels are controlled by the amount of charge that is programmed or stored on the floating gate; if the amount of charge on the floating gate is above a certain reference level, the cell is considered to be in a different state (e.g., programmed, erased).

Multilevel cells have recently been introduced to greatly increase the density of a flash memory device. This technology enables storage of multiple bits per memory cell by charging the floating gate of the transistor to different levels. This technology takes advantage of the analog nature of a traditional flash cell by assigning a bit pattern to a specific voltage range. This technology permits the storage of two or more bits per cell, depending on the quantity of voltage ranges stored on the cell.

With the introduction of multilevel cells, the precision at which the voltages on the device are sensed must greatly increase. This increases the complexity of testing the memory devices. For example, the analog voltages used on the devices must be set on a die-by-die basis due to minute differences in the die composition. This greatly increases test time and test cost.

For the reasons stated above, and for other reasons stated below which will become apparent to those skilled in the art upon reading and understanding the present specification, there is a need in the art for a more flexible method of testing memory devices.

DETAILED DESCRIPTION

Figure 1:
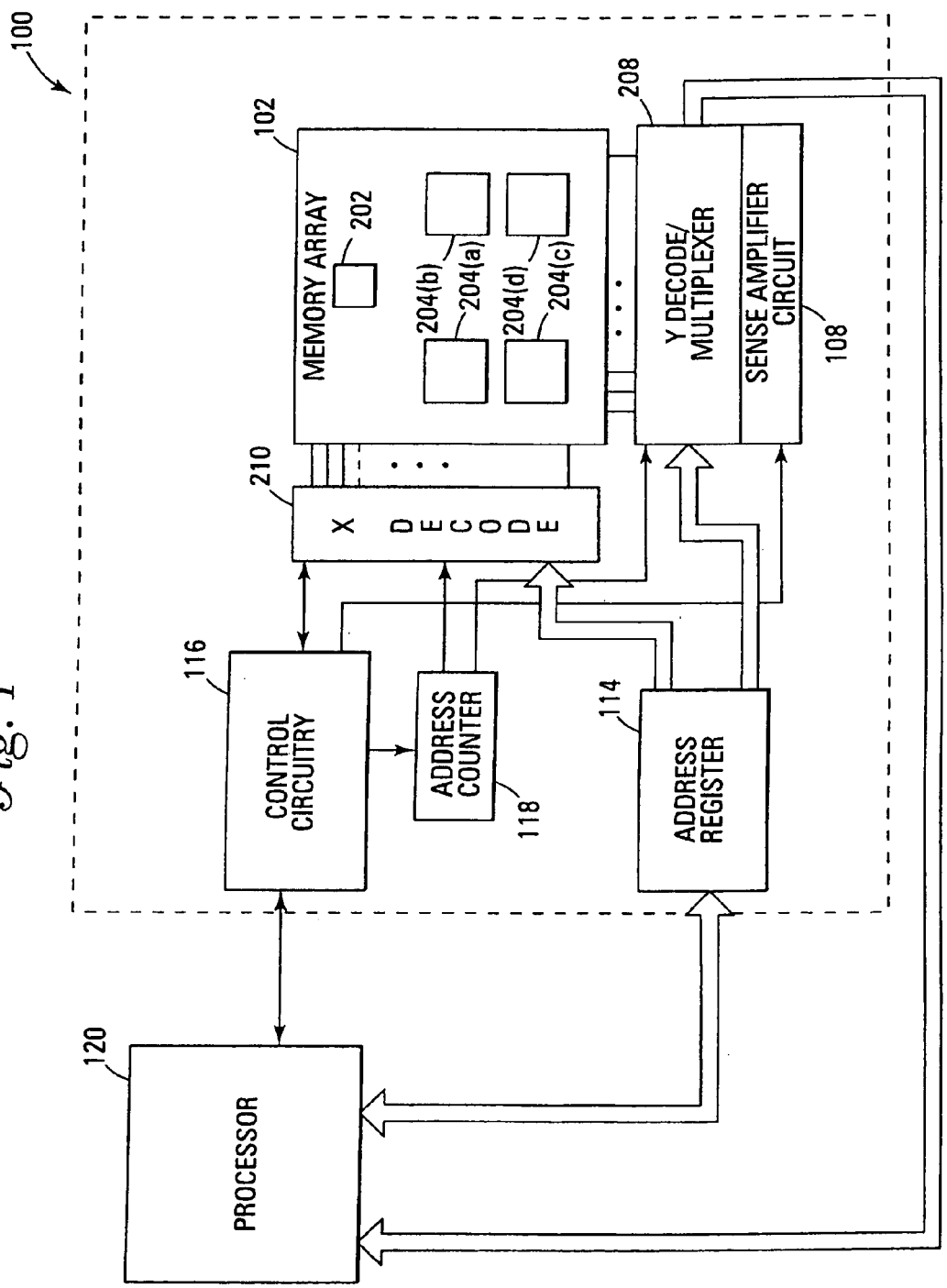
FIG. 1 is a block diagram of one embodiment of a memory system of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a simplified block diagram of a memory system incorporating one embodiment of a flash memory 100 of the present invention having a scratch control memory array. As shown, the flash memory 100 has control circuitry 116 to control memory operations to a memory array 102. These memory operations may include reading, writing and erasing. In one embodiment, the control circuitry 116 is a microsequencer 116.

The microsequencer 116 may go through a series of steps that select a word line in the memory array, apply a controlled voltage for a given duration of time, clean the residual voltages off the bit lines, verify whether the cell has been programmed to a satisfactory level, and repeat those steps until the desired operation is complete. The microsequencer 116 can perform other tasks depending on the embodiment.

The flash memory is also shown having an address register 114, an address counter 118, an X decode circuit 210, a Y decode circuit/multiplexer circuit 208 and a sense amplifier circuit 108. The X decode circuit 210 decodes address requests to rows of memory cells in the memory array 102. Although not shown, the X decode circuit 210 may include a multiplexer circuit to combine two or more signals. The Y decode/multiplexer circuit 208 decodes and multiplexes address requests to columns of memory cells in the memory array 102. The sense amplifier circuit 108 reads addressed or accessed memory cells in the memory array 102.

The memory array 102 has four array blocks 204(a-d) of memory cells that may be referred to as the primary array 204(a-d). The memory array 102 is also shown as having a "scratch control memory array" 202. The scratch control memory array is coupled to the memory array 102 so as to use the same peripheral circuitry as the array blocks 204(a-d). The memory array 102 is discussed subsequently in greater detail with reference to FIG. 2.

The scratch control memory array 202 stores the steps of the microcode that are executed by the microsequencer 116. The users testing the memory device can store different algorithms in this array 202 for a memory device test that has to be performed on a part-by-part basis. One embodiment may require extra circuitry to execute the test steps, depending on the desired results. Once the test steps have been stored, its execution by the microsequencer is initiated, the steps are retrieved from the scratch control memory array 202, and the microsequencer can then report back the results of the test steps. Therefore, the scratch control memory array 202 of the present invention allows parallel testing of memory devices, thereby increasing testing throughput and reducing costs.

Although, FIG. 1 is illustrated as having a primary array with four erasable array blocks 204(a-c) of memory, it is understood in the art that the present invention is not limited to any certain quantity of erasable blocks.

An external processor 120 is coupled to the control circuitry 116 to provide external commands to the flash memory 100. The processor 120 is also coupled to the address register 114 to provide address requests. The processor 120 of the system of the present invention is any microprocessor, microcontroller, or other type of control circuitry.

The flash memory device illustrated in FIG. 1 has been simplified to facilitate a basic understanding of the features of the memory of the present invention. A more detailed understanding of internal circuitry and functions of flash memories are known to those skilled in the art.

Figure 2:
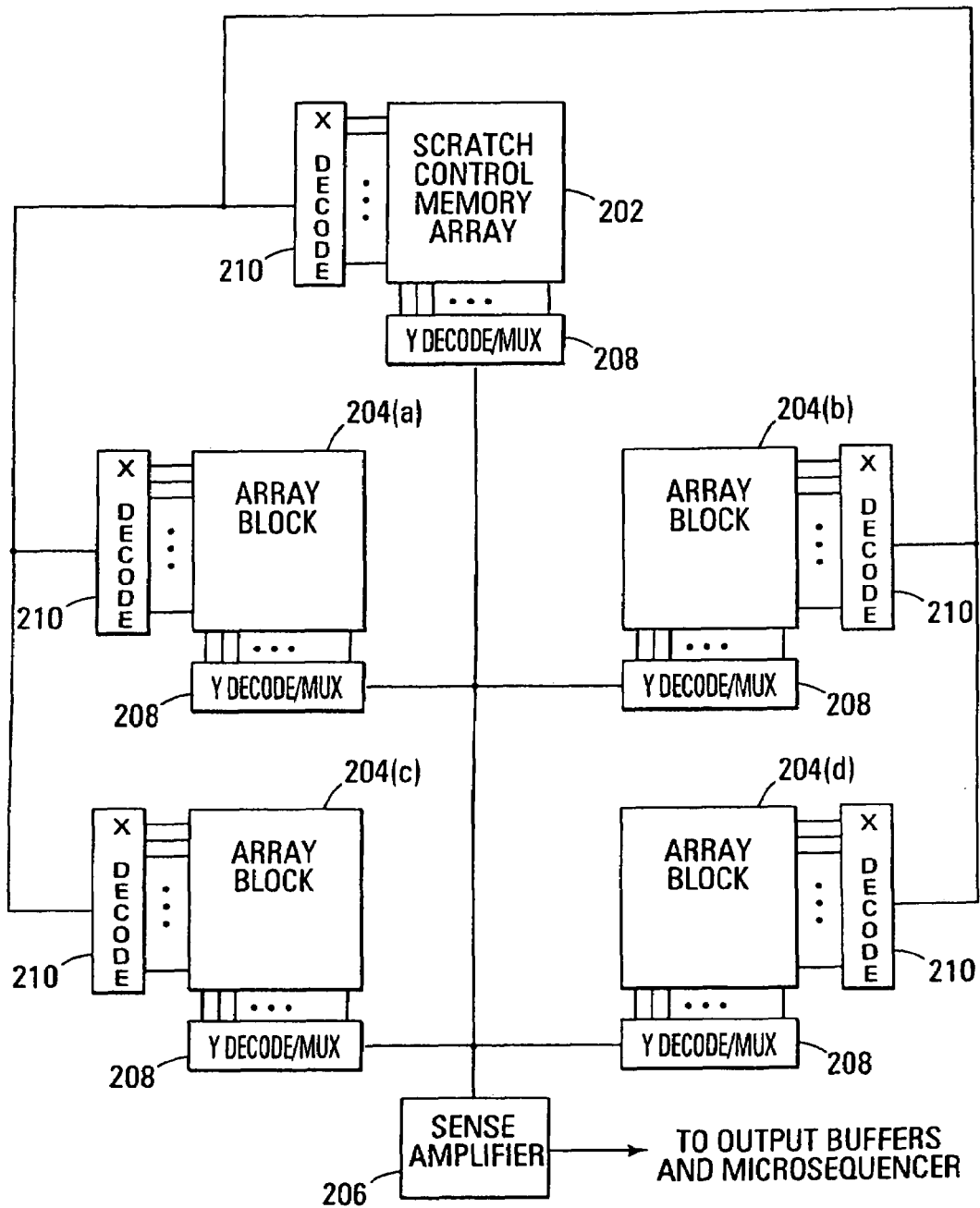
FIG. 2 is a block diagram of one embodiment of the memory array incorporating the scratch control memory array of the present invention.

FIG. 2 illustrates a block diagram of one embodiment of the memory array 102 incorporating the scratch control memory array 202 and support circuitry 208 and 210 of the present invention. The array blocks 204(a-d) are coupled to the X decode 210 and the Y decode/multiplexer 208. The scratch control memory array 202 is also coupled to the X decode 210 and the Y decode/multiplexer 208. This limits the amount of added elements needed to store and implement the operating parameters.

The sense amplifier 206 reads the state of the addressed cells in the array blocks 204(a-d) as well as the memory cells of the scratch control memory array 202. As illustrated in FIG. 2, an output of sense amplifier 206 is selectively coupled to the output buffers of the memory device as is well know in the art. The output of the sense amplifier 206 is also coupled to the microsequencer or other control circuit so that the instructions stored in the scratch control memory array 202 can be accessed and executed.

An advantage of using a sense amplifier 206, as described, is that it creates a very reliable system. In addition, since the scratch control memory array 202 is coupled as a normal memory block, the memory is able to use an internal algorithm of the control circuitry 116 to verify if an operating parameter was successfully written to an associated local latch.

Figure 3:
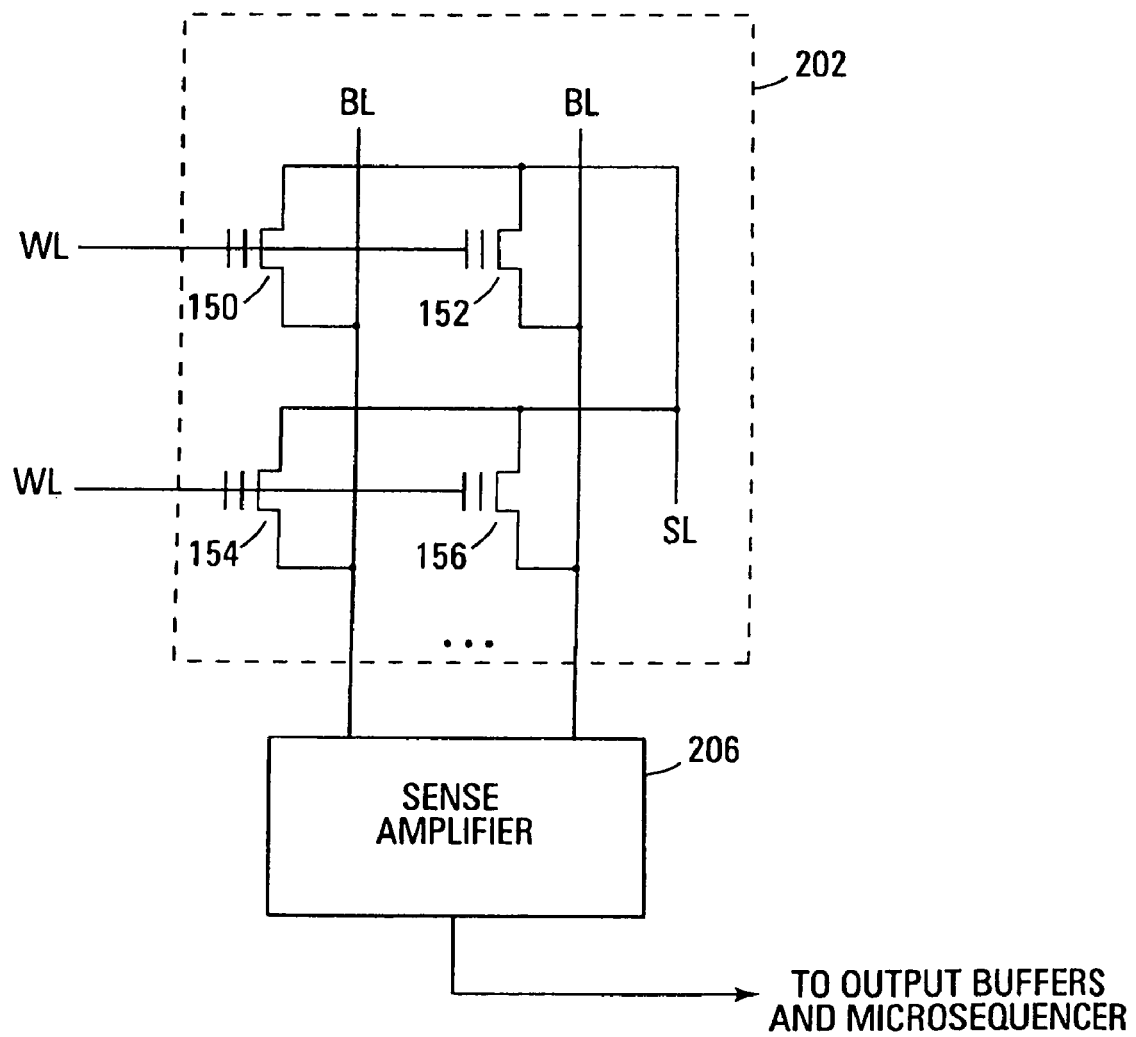
FIG. 3 is a block diagram of one embodiment of the memory cells of the scratch control memory array of the present invention.

Two common types of Flash memory array architectures are the "NAND" and "NOR" architectures. FIG. 3 illustrates individual memory cells 150, 152, 154 and 156 of the scratch control memory array 202, in the NOR architecture, as they are coupled to a sense amplifier 206.

Word lines WL are coupled to control gates of the memory cells 150, 152, 154 and 156 to selectively activate the memory cells 150, 152, 154 and 156. A source line SL is also coupled to memory cells 150, 152, 154 and 156. In addition, each memory cell 150, 152, 154 and 156 is coupled to sense amplifier 206 with a respective bit line BL. The sense amplifier 206 may be a current sense amplifier or a voltage sense amplifier. The operation of the word, bit, and source lines are well known in the art and are not discussed further.

The memory cell configuration of FIG. 3 is for purposes of illustration only. The present invention is not limited to any one memory architecture.

For purposes of clarity, FIG. 3 shows only four non-volatile memory cells 150, 152, 154 and 156. However, the scratch control memory array 202 is comprised of as many memory cells as required to store the microsequencer instructions of the present invention.

Figure 4:
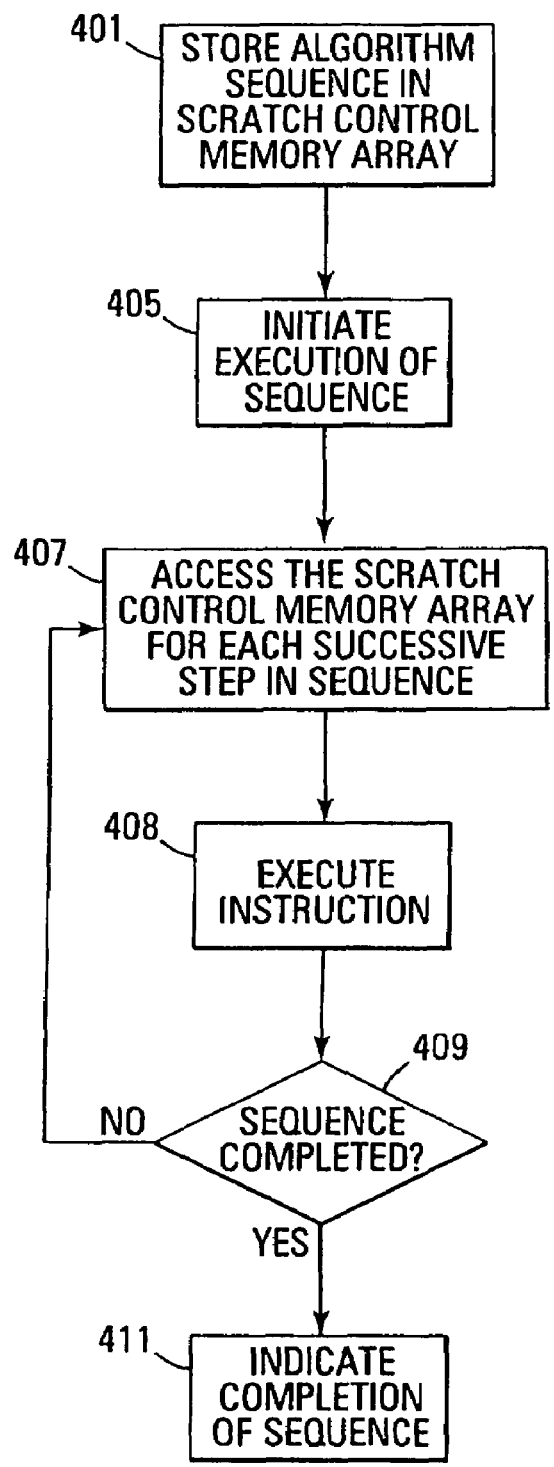
FIG. 4 is a flowchart of one embodiment for using the scratch control memory of the present invention.

FIG. 4 illustrates a flowchart of one embodiment for using the scratch control memory array of the present invention. The steps of the test algorithm sequence are stored in the scratch control memory array 401. The test sequence may be a reliability test for the memory device, a stress function for the memory cells of the memory array, or any other type of instruction sequence that can be stored in the scratch control memory. The present invention is not limited to any one instruction sequence.

The test sequence is then executed in response to an initiation command 405. The initiation, in one embodiment, comes from a test technician or other person involved in the manufacturing/development process. In another embodiment, the sequence for the test algorithm is initiated automatically upon some condition of the memory device being true. For example, if a predetermined number of cells of the primary memory array are flagged as bad, the test sequence steps stored in the scratch control memory are initiated when the quantity of bad cells crosses a predetermined threshold of bad cells. The test sequence can then be used to perform a diagnostics test on the primary array. The present invention is not limited to any one type of test sequence initiation.

Once initiated, the microsequencer or other controller circuit accesses the scratch control memory for each instruction to be performed 407. The retrieved instruction is then executed as required 408.

Each instruction is checked to determine if the end of the sequence of test instructions has been reached 409. This may be accomplished by an end of sequence command, a non-operational command, or some other type of flag to indicate the end of the test sequence.

If the test sequence has not ended, the method returns to retrieving the next sequence step in the method 407. If the test sequence has ended, an indication is given to indicate an end to the test sequence 411. This indication may be a report on the results of the test sequence that is stored in the scratch control memory array (e.g., quantity of failed cells). Other indications include a successful completion indication, a failed test indication, or any other type of end of test indication.

In an alternate embodiment, the test sequence can be updated by the test technician. This update may be done in response to the results of the initial execution of the test sequence.

Figure 5:
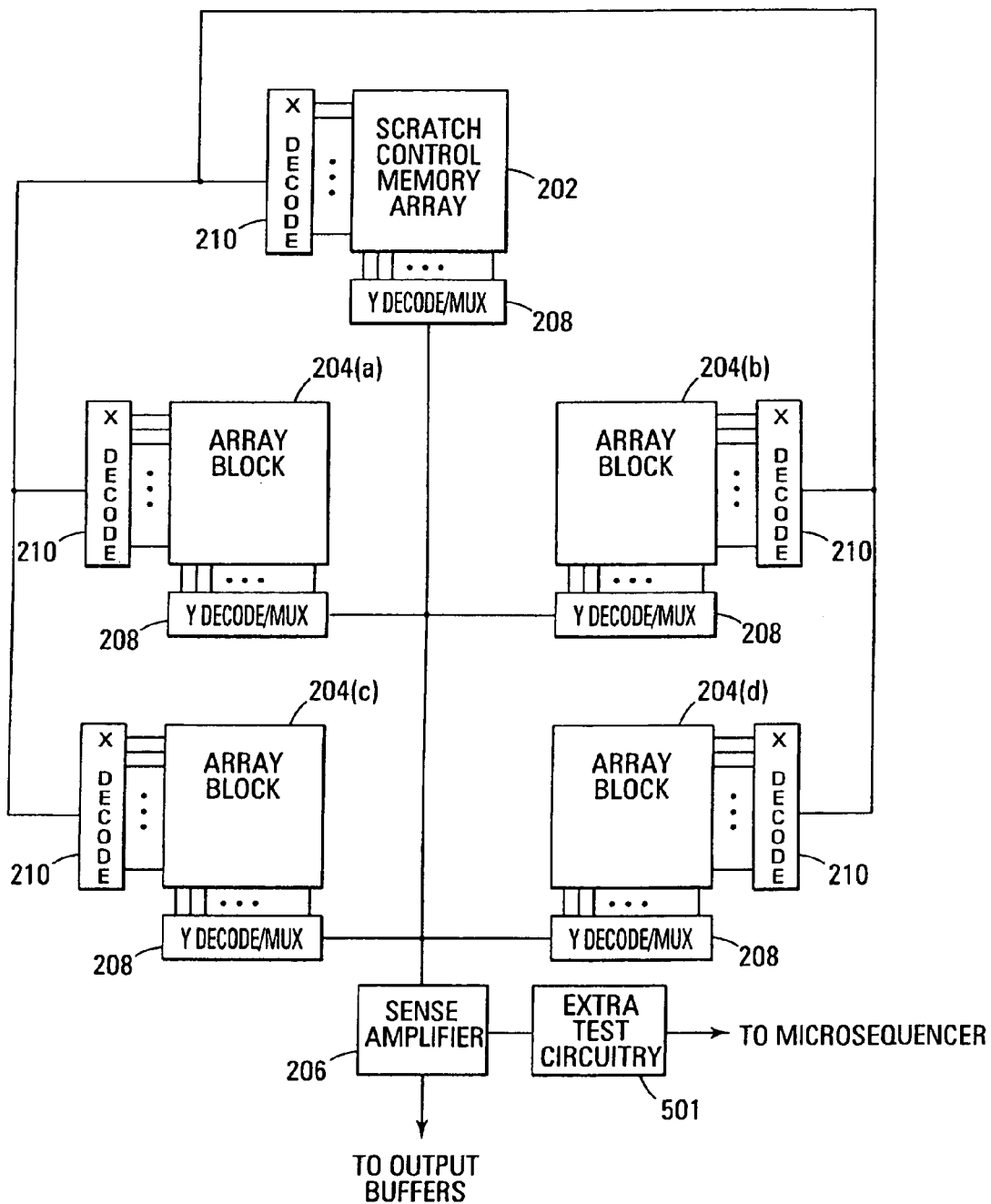
FIG. 5 shows a block diagram of an alternate embodiment of the scratch control memory array of the present invention.

FIG. 5 illustrates an alternate embodiment of the scratch control memory array of the present invention. This embodiment includes extra test circuitry 501 that is used in conjunction with the test sequence that is stored in the scratch control memory array 202. This test circuitry 501 may be necessary if the test sequence requires a test function that is not normally present in a flash memory device.

In one embodiment, the flash memory device implements multi-level cells that are capable of storing two or more logic levels per cell. This requires a very precise and flexible scheme to determine the various voltage ranges in the cell. The extra test circuitry 501 can be used in conjunction with the microsequencer or other controller circuitry to test the presence and accuracy of the multiple ranges. The present invention is not limited to any one use for the extra circuitry that is used by the test sequence/algorithm.

Figure 6:
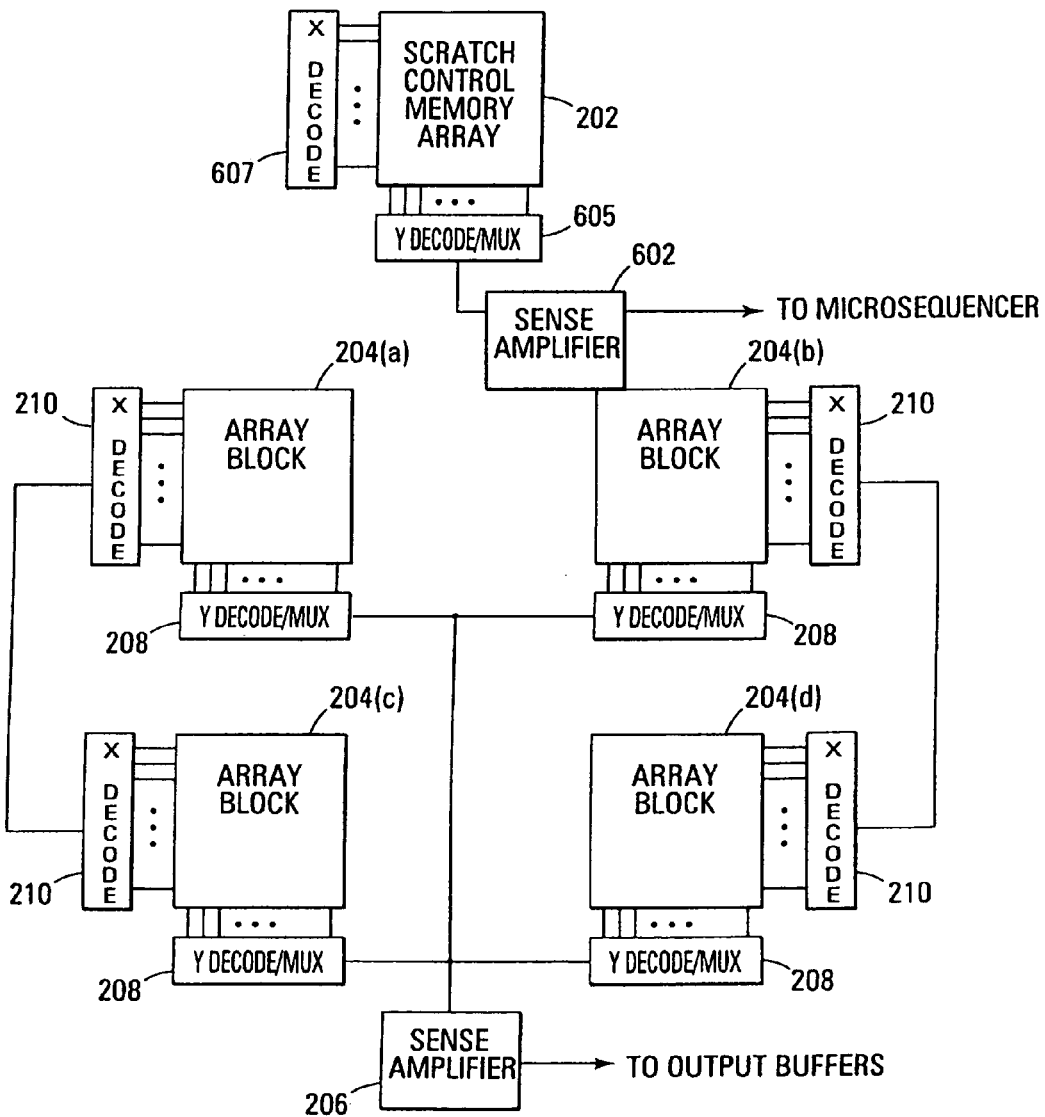
FIG. 6 shows a block diagram of yet another embodiment of the scratch control memory array of the present invention.

FIG. 6 illustrates yet another alternate embodiment of the scratch control memory array of the present invention. In this embodiment, a first sense amplifier 206 is used for the primary memory array 204(a-d) and a second sense amplifier 602 is used for the scratch control memory array 202. The second sense amplifier 602 is coupled to the microsequencer or other control circuit so that the instructions stored in the scratch control memory array 202 can be executed.

Also in the embodiment of FIG. 6, the scratch control memory array 202 uses separate X and Y decoder circuitry 605 and 607 respectively. This enables the microsequencer to access the scratch control memory array 202 separately from the primary array 204(a-d).

CONCLUSION

The scratch control memory array of the present invention provides the memory device manufacturer with the capability of storing complex test and reliability sequences in a separate memory area that is accessible by test technicians. Any desired test algorithm sequence can be stored in the memory and initiated by the technician. This enables the memory devices to be tested in parallel during the manufacturing process, thus greatly decreasing the total test time required for the memory devices. Additionally, unlike the prior art that used hard coded instructions for the controller circuit, the test algorithm sequence of the present invention can be updated in the non-volatile scratch control memory array.

The present invention also provides the ability to easily set internal analog reference voltages on a die-by-die basis. By storing a predetermined test algorithm that sets these voltages dependent on each die's composition, testing time and, therefore, testing costs are greatly reduced.

The embodiments of the present invention are not limited to any one type of memory technology. For example, the scratch control memory array may be implemented in a NOR-type flash memory device, a NAND-type flash memory device, or any other type memory device that can be constructed with such a memory array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following and equivalents thereof.

What is claimed is:

1. A test system for testing a plurality of non-volatile memory devices in parallel, the test system comprising:
   a plurality of non-volatile memory devices, each device comprising a plurality of memory arrays wherein each array is comprised of a plurality of memory blocks;
   a controller circuit, coupled to each of the plurality of memory arrays, for executing instructions and generating control signals in response to the test instructions; and
   a scratch control array of non-volatile memory cells coupled to each of the plurality of memory arrays, each scratch control array being separate from and having a quantity of cells that is different than the non-volatile memory array to which it is coupled, each scratch control array storing the instructions for execution by the controller circuit, the instructions forming a test sequence executed by each controller circuit when a quantity of defective cells of the at least one array block exceeds a predetermined threshold of defective cells.

2. The test system of claim 1 wherein the controller circuit is adapted to store, in the scratch control array coupled to its respective controller circuit, results from execution of the instructions.

3. The test system of claim 1 wherein the instructions together comprise a test sequence executed by the respective controller circuit on each memory block.

4. The test system of claim 1 wherein the instructions together comprise a memory cell stress sequence that is executed by the respective control circuitry on each memory block.

5. The test system of claim 1 wherein execution of the stored instructions is initiated independently in each controller circuit by a signal external to each non-volatile memory device.

6. The test system of claim 1 wherein each non-volatile memory device comprises one of a NAND or a NOR architecture.

7. A method for parallel testing a plurality of non-volatile memory devices each having a scratch control non-volatile memory array comprised of a quantity of cells that is separate from and less than any memory array blocks in each non-volatile memory device, the method comprising:
   initiating execution of the parallel testing;
   accessing the scratch control non-volatile memory array of each memory device to retrieve a plurality of test instructions;
   a control circuit executing the plurality of test instructions until an end of test sequence command is reached;
   generating a plurality of memory device control signals in response to the execution of the plurality of test instructions in each memory device; and
   updating the plurality of test instructions in response to results of the execution of the plurality of test instructions.

8. The method of claim 7 and further including storing the results of the execution of the plurality of test instructions in the scratch control non-volatile memory array.

9. The method of claim 7 and further including storing the results of the execution of the plurality of test instructions prior to updating the plurality of test instructions.

10. The method of claim 7 wherein executing the plurality of test instructions includes:
    the control circuit selecting a word line in its respective memory array;
    biasing the selected word line with a controlled voltage for a time interval;

cleaning the controlled voltage off the selected word line; and verifying that cells on the word line have been programmed to a predetermined level.

11. The method of claim 7 wherein initiating the execution of the parallel testing is in response to a quantity of defective cells of the memory blocks exceeding a threshold of defective cells.

12. The method of claim 7 wherein updating the plurality of test instructions is performed manually.

13. A method of parallel operation of a plurality of non-volatile memory devices each having a scratch control non-volatile memory array comprising a separate quantity of cells that is less than any memory blocks of non-volatile memory cells in each non-volatile memory device, the method comprising:

storing a plurality of memory device test instructions in the scratch control non-volatile memory array of each memory device, the test instructions representing a test algorithm sequence and having an end of sequence command, the scratch control non-volatile memory array comprising a quantity of non-volatile memory cells that are separate from and the quantity being less than any memory block of each non-volatile memory device;

initiating execution of the test algorithm sequence in each memory device in which a quantity of defective memory cells of the memory blocks exceeds a threshold of defective cells;

accessing the scratch control memory array to retrieve each instruction of the plurality of memory device test instructions;

checking each test instruction for an end of sequence command;

executing each of the plurality of memory device test instructions until the end of sequence command is executed;

generating a memory device control signal in response to the execution of the plurality of memory device test instructions; and storing results of the test algorithm sequence in the scratch control memory array.

14. The method of claim 13 wherein executing each of the plurality of test instructions includes:

the control circuit selecting a word line in its respective memory array;

biasing the selected word line with a controlled voltage; and verifying that cells on the word line have been programmed.

15. The method of claim 13 wherein at least one of the plurality of non-volatile memory devices is comprised of a memory array having a NAND architecture.

16. The method of claim 13 wherein each scratch control non-volatile memory array is coupled to a separate sense amplifier from each memory block of a respective memory device.

* * * * *